United States Patent
Kim et al.

(10) Patent No.: US 7,361,957 B2
(45) Date of Patent: Apr. 22, 2008

(54) DEVICE FOR ELECTROSTATIC DISCHARGE PROTECTION AND METHOD OF MANUFACTURING THE SAME

(75) Inventors: Kil Ho Kim, Cheongju-si (KR); Yong Icc Jung, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 11/426,037

(22) Filed: Jun. 23, 2006

(65) Prior Publication Data

US 2006/0244072 A1  Nov. 2, 2006

Related U.S. Application Data

(62) Division of application No. 11/082,010, filed on Mar. 16, 2005, now Pat. No. 7,081,394.

(30) Foreign Application Priority Data

Mar. 17, 2004  (KR) ............................... 2004-18063

(51) Int. Cl.
*H01L 23/62* (2006.01)
*H01L 29/72* (2006.01)
*H01L 29/74* (2006.01)
*H01L 31/111* (2006.01)
*H01L 29/73* (2006.01)

(52) U.S. Cl. ..................... 257/355; 257/173; 257/174; 257/356; 257/357; 257/358; 257/359; 257/360; 257/361; 257/362; 257/363

(58) Field of Classification Search ................ 257/335, 257/173–174, 355–363
See application file for complete search history.

(56) References Cited

U.S. PATENT DOCUMENTS

| | | | | |
|---|---|---|---|---|
| 5,670,814 A * | 9/1997 | Wu et al. | ..................... | 257/360 |
| 5,760,448 A * | 6/1998 | Maeda | ......................... | 257/362 |
| 5,925,910 A * | 7/1999 | Menegoli | ..................... | 257/335 |
| 5,960,275 A * | 9/1999 | So et al. | ....................... | 438/211 |
| 6,242,780 B1 * | 6/2001 | Pan | .............................. | 257/355 |
| 6,927,442 B2 * | 8/2005 | Kaneko et al. | .............. | 257/299 |
| 2003/0038316 A1 * | 2/2003 | Tsuchiko et al. | ........... | 257/324 |
| 2003/0111689 A1 * | 6/2003 | Moroni et al. | .............. | 257/336 |
| 2004/0227204 A1 * | 11/2004 | Hebert | ........................ | 257/491 |

* cited by examiner

*Primary Examiner*—Ida M Soward
(74) *Attorney, Agent, or Firm*—Marshall, Gerstein & Borun LLP

(57) ABSTRACT

The present invention relates to a device for electrostatic discharge protection (ESD). According to an embodiment of the present invention, a device for electrostatic discharge protection includes a semiconductor substrate, a plurality of field oxide films formed in predetermined regions on the semiconductor substrate, a gate formed in a predetermined region on the semiconductor substrate between the field oxide films, a well pick-up region formed in a predetermined region on the semiconductor substrate between the field oxide films, a source formed in a predetermined region on the semiconductor substrate between the field oxide film and the gate, a drain drift region formed in a predetermined region on the semiconductor substrate between the gate and the field oxide film, a drain active region of a concentration higher than that of the drain drift region, the drain active region being formed in the drain drift region, and an oxide film formed on the semiconductor substrate on a boundary of the drain drift region and the drain active region. Accordingly, the current concentrated on the surface of the device can be uniformly distributed over the entire device.

6 Claims, 10 Drawing Sheets

DEVICE FOR ELECTROSTATIC DISCHARGE PROTECTION AND METHOD OF MANUFACTURING THE SAME

CROSS-REFERENCE TO RELATED APPLICATION

This patent is a division of U.S. Ser. No. 11/082,010, filed Mar. 16, 2005, the disclosure of which is hereby expressly incorporated herein for all purposes.

BACKGROUND

1. Field of the Invention

The present invention relates to a device for electrostatic discharge protection (hereinafter, referred to as "ESD"), and more specifically, to an ESD device in which an oxide film is formed on a boundary of a drain drift region and a drain active region to implement an OLI_GG_DDDNMOS device, whereby the current concentrated on the surface of the device can be uniformly distributed over the entire device.

2. Discussion of Related Art

In manufacturing semiconductor a chip that operates at high voltage, the role of a device for ESD protection, which protects the chip from electrostatic, is very important.

One of the basic characteristics that a semiconductor device operating at high voltage must have is that a junction breakdown voltage must be higher than an operating voltage. In order to satisfy this characteristic, a N-type MOSFET adopting the drain in which a dopant is diffused twice, as shown in FIG. 1, so-called Double Diffused Drain N-type MOSFET (DDDNMOS) is used as a basic element.

FIGS. 1a and 1b are cross-sectional views of conventional unidirectional and bidirectional DDDNMOS devices.

Referring to FIG. 1a, a plurality of field oxide films 102 are formed in predetermined regions on a P-type semiconductor substrate 101. A gate 103 is formed over the semiconductor substrate 101 between the field oxide films 102. A well pick-up region 104 is formed on the semiconductor substrate 101 between the field oxide film 102 and the field oxide film 102 by means of a high concentration P-type impurity ion implant process. A source active region 105 is formed on the semiconductor substrate 101 between the field oxide film 102 and the gate 103 by means of a high concentration N-type impurity ion implant process. Furthermore, a drain is formed between the gate 103 and the field oxide films 102 by performing a dual N-type impurity ion implant process. The drain region has a drain active region 107 of a high concentration formed within the drain drift region 106 of a low concentration.

Generally, the lower the impurity concentrations of two regions, which are in contact with each other with an electrically opposite polarity, the higher the junction breakdown voltage. Accordingly, the drain in which a dopant is diffused in dual is formed by means of the method as shown. In this state, if the impurity concentration of the drift region, which is in contact with a P-well region having an electrically opposite polarity, is lowered, a desired junction breakdown voltage can be implemented.

A DDDNMOS device can be classified into two kinds depending on its formation method; a structure in which a dopant is diffused into only the drain twice, as shown in FIG. 1a, i.e., an unidirectional DDDNMOS device, and a structure in which a dopant is diffused into both the drain and the source, as shown in FIG. 1b, i.e., a bidirectional DDDN-MOS device. The junction breakdown voltages of the two structures are almost the same.

The structure of the bidirectional DDDNMOS device will be describe with reference to FIG. 1b. A plurality of field oxide films 202 are formed in predetermined regions on a P-type semiconductor substrate 201. A gate 203 is formed over the semiconductor substrate 201 between the field oxide films 202. A well pick-up region 204 is formed on the semiconductor substrate 201 between the field oxide film 202 and the field oxide film 202 by means of a P-type impurity ion implant process. A source is formed on the semiconductor substrate 201 between the field oxide film 202 and the gate 203 by means of a dual N-type impurity ion implant process. A source active region 206 of a high concentration is formed within a source drift region 205 of a low concentration. Furthermore, a drain is formed between the gate 203 and the field oxide films 202 by means of a dual N-type impurity ion implant process. In this time, a drain active region 208 of a high concentration is formed within a drain drift region 207 of a low concentration.

FIGS. 2a and 2b are views illustrating electrode connection modes of GG_DDDNMOS devices in which the conventional unidirectional and bidirectional DDDNMOS devices are used as devices for electrostatic discharge protection.

In order for a DDDNMOS device operating at high voltage to be used as a device for ESD protection, an electrode is constructed in such a manner that the gate, the source and the well pick-up region are bundled and grounded, and a positive voltage is applied to the drain, as shown in FIGS. 2a and 2b. In the GG_DDDNMOS (Gate Grounded DDDNMOS) having the electrode constructed above, if a voltage applied to the drain is lower than an operating voltage, current rarely flows since the gate and source, and a channel (region under the gate where a current path is formed) keeps almost the same electrical potential.

On the contrary, if the voltage applied to the drain is higher than the junction breakdown voltage, an impact ionization phenomenon occurs at the boundary where the semiconductor substrate and the drain drift region meet, and a plurality of carriers are thus formed. As a result, a parasitic NPN-BJT (NPN Bipolar Junction Transistor) is formed, and a large amount of current thus flows between the drain and the source. Consequently, in the GG_DDDNMOS having the electrode constructed above, the current does not flow at a voltage lower than the operating voltage, but the current smoothly flows at a voltage higher than the operating voltage. Accordingly, the GG_DDDNMOS can be used as a device for ESD protection, which digests undesired stress current in an electrostatic discharge situation to protect internal circuits.

FIGS. 3a and 3b show multi-finger structures of conventional unidirectional and bidirectional GG_DDDNMOS devices.

In order to secure the capability of coping with a large amount of stress current when GG_DDDNMOS is used as a device for ESD protection, a multi-finger GG_DDDN-MOS as shown in FIGS. 3a and 3b is used.

FIGS. 4a and 4b are views illustrating the current paths of the conventional unidirectional and bidirectional GG_DDD-NMOS devices.

FIGS. 5a and 5b are views illustrating thermal breakdown points of the conventional unidirectional and bidirectional GG_DDDNMOS devices.

FIGS. 4a, 4b, 5a and 5b show a conductive path along which current flows when a GG_DDDNMOS operates as a device for ESD protection.

If a parasitic NPN-BJT is formed in the GG_DDDNMOS and a high current starts to flow, low resistive current paths are formed over the drain, the channel and the source. Current paths A and B have a characteristic that they are limited to a restricted region along the surface of the device. If the current paths A and B are limitedly formed along the surface of the device and current is concentrated on that portion, a temperature of the surface of the device sharply rises and a thermal breakdown phenomenon is thus generated on the surface. The phenomenon that the current is concentrated on the surface and the thermal breakdown phenomenon accordingly serve as a factor to degrade the capability of a GG_DDDNMOS to cope with ESD stress current. After a result of confirming a location where the thermal breakdown phenomenon is generated as the stress current rises when GG_DDDNMOS operates as a device for ESD protection through simulation, it was found that the thermal breakdown phenomenon is generated because a temperature sharply rises in a very limited region of the surface of the device at a boundary C of the drain active region 106 and the drain drift region 107, as shown in FIGS. 5*a* and 5*b*.

Accordingly, in order to improve the capability of a GG_DDDNMOS to cope with ESD stress current when the GG_DDDNMOS is used as the device for ESD protection of the semiconductor chip that operates at high voltage, there is a need for a method in which concentration of the current on the surface of the device is mitigated so that the current is uniformly distributed over the device.

SUMMARY OF THE INVENTION

Accordingly, the present invention has been made in view of the above problems, and it is an object of the present invention to provide an ESD device and method of manufacturing the same in which concentration of the current on the surface of a device is mitigated to improve the capability of a device to cope with ESD stress current.

Another object of the present invention is to provide an ESD device and method of manufacturing the same in which a GG_DDDNMOS is used as a device for high voltage ESD protection, wherein an oxide film is added at a point where a drain drift region and a drain active region of the GG_DDDNMOS meet, thereby solving the conventional problem.

To achieve the above object, according to an embodiment of the present invention, there is provided a device for electrostatic discharge protection, comprising: a semiconductor substrate, a plurality of field oxide films formed in predetermined regions on the semiconductor substrate, a gate formed in a predetermined region on the semiconductor substrate between the field oxide films, a well pick-up region formed in a predetermined region on the semiconductor substrate between the field oxide films, a source formed in a predetermined region on the semiconductor substrate between the field oxide film and the gate, a drain drift region formed in a predetermined region on the semiconductor substrate between the gate and the field oxide film, a drain active region of a concentration higher than that of the drain drift region, the drain active region being formed in the drain drift region, and an oxide film formed on the semiconductor substrate on a boundary of the drain drift region and the drain active region.

The well pick-up region, the source and the gate are applied with a ground voltage, and the drain active region is applied with a positive voltage. Also, the oxide film is formed not to be in contact with the gate.

According to another embodiment of the present invention, there is provided a device for electrostatic discharge protection, comprising: a semiconductor substrate, a plurality of field oxide films formed in predetermined regions on the semiconductor substrate, a gate formed in a predetermined region on the semiconductor substrate between the field oxide films, a well pick-up region formed in a predetermined region on the semiconductor substrate between the field oxide films, a source drift region formed in a predetermined region on the semiconductor substrate between the field oxide film and the gate, a source active region of a concentration higher than that of the source drift region, the source active region being formed within the source drift region, a drain drift region formed in a predetermined region on the semiconductor substrate between the gate and the field oxide film, a drain active region of a concentration higher than that of the drain drift region, the drain active region being formed in the drain drift region, and an oxide film formed on the semiconductor substrate on a boundary of the drain drift region and the drain active region.

The well pick-up region, the source and the gate are applied with a ground voltage, and the drain active region is applied with a positive voltage. Also, the oxide film is formed not to be in contact with the gate.

According to an embodiment of the present invention, there is provided a method of manufacturing a device for electrostatic discharge protection, comprising the steps of: forming a plurality of field oxide films in a predetermined region on a semiconductor substrate, forming a gate in a predetermined region on the semiconductor substrate between the field oxide films, performing an impurity ion implant process to form a well pick-up region in a predetermined region between the field oxide films, performing a low-concentration impurity ion implant process to form a drain drift region in a predetermined region on the semiconductor substrate between the gate and the field oxide film, performing a high-concentration impurity ion implant process to form a source in a predetermined region on the semiconductor substrate between the field oxide film and the gate and to form a drain active region within the drain drift region, and forming an oxide film on the semiconductor substrate on a boundary of the drain drift region and the drain active region.

According to another embodiment of the present invention, there is provided a method of manufacturing a device for electrostatic discharge protection, comprising the steps of: forming a plurality of field oxide films in a predetermined region on a semiconductor substrate, forming a gate in a predetermined region on the semiconductor substrate between the field oxide films, performing an impurity ion implant process to form a well pick-up region in a predetermined region between the field oxide films, performing a low-concentration impurity ion implant process to form a source drift region in a predetermined region on the semiconductor substrate between the field oxide film and the gate and to form a drain drift region in a predetermined region on the semiconductor substrate between the gate and the field oxide film, performing a high-concentration impurity ion implant process to form a source active region within the source drift region and to form a drain active region within the drain drift region, and forming an oxide film on the semiconductor substrate on a boundary of the drain drift region and the drain active region.

The field oxide film includes a trench type element isolation film. The oxide film is formed by the same process as the field oxide film, and is formed not to be in contact with the gate.

DETAILED DESCRIPTION OF PREFERRED EMBODIMENTS

Now, the preferred embodiments according to the present invention will be described with reference to the accompanying drawings.

Figure 1A:
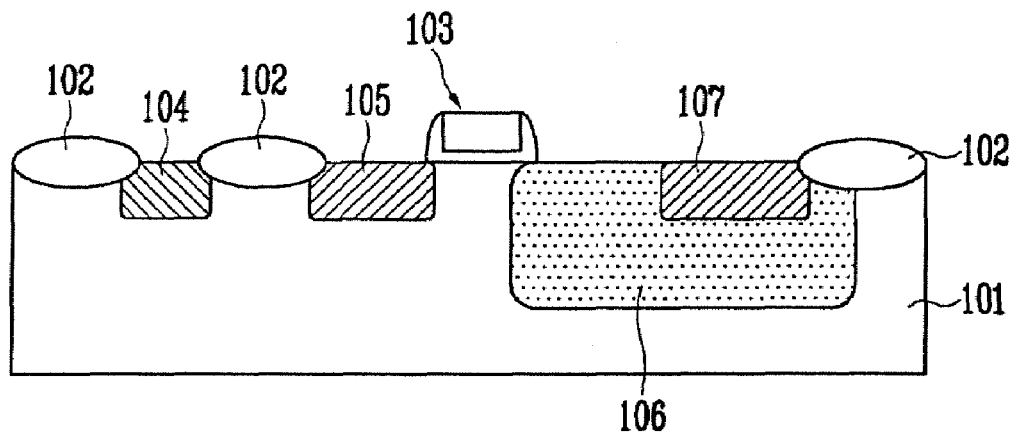
FIGS. 1a and 1b are cross-sectional views of conventional unidirectional and bidirectional DDDNMOS devices.
Figure 1B:
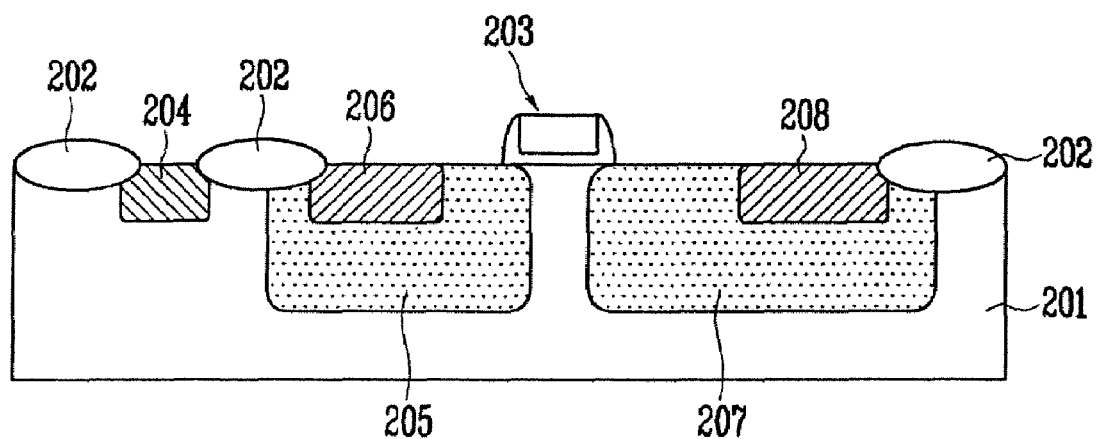
Figure 2A:
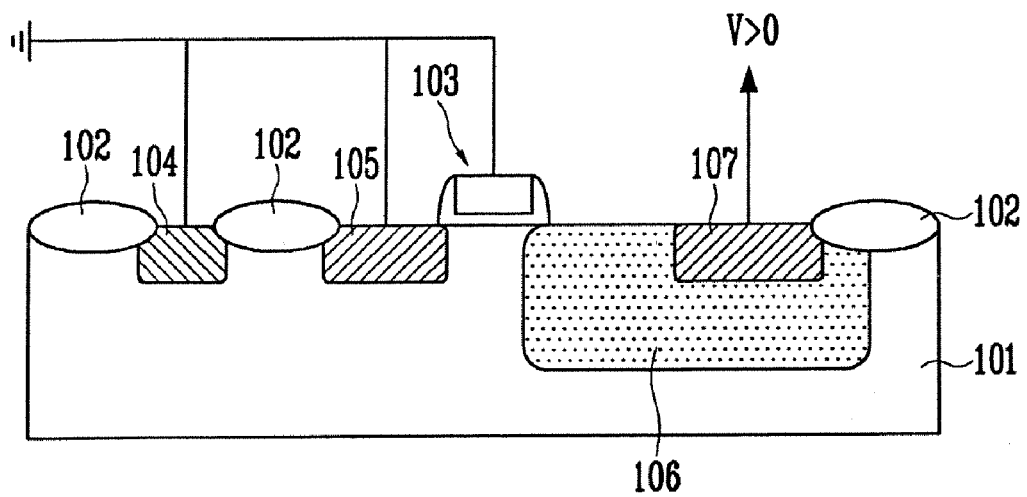
FIGS. 2a and 2b are views illustrating electrode connection modes of GG_DDDNMOS devices in which the conventional unidirectional and bidirectional DDDNMOS devices are used as devices for electrostatic discharge protection.
Figure 2B:
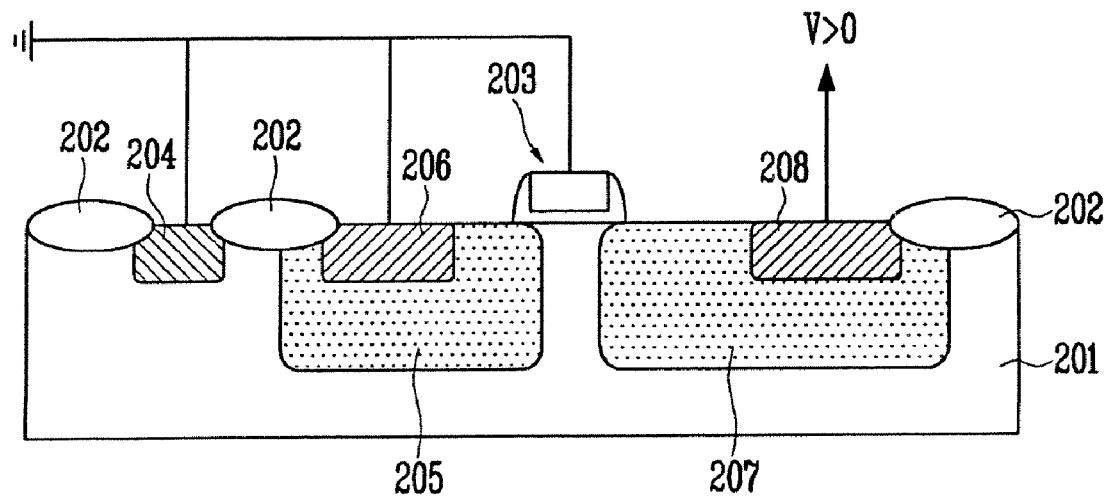
Figure 3A:
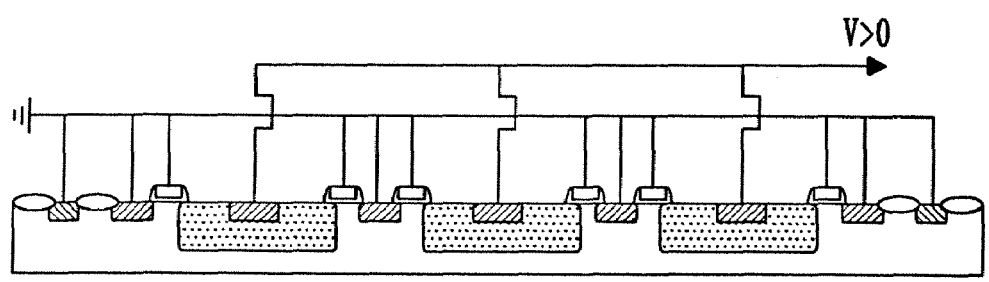
FIGS. 3a and 3b show multi-finger structures of conventional unidirectional and bidirectional GG_DDDNMOS devices.
Figure 3B:
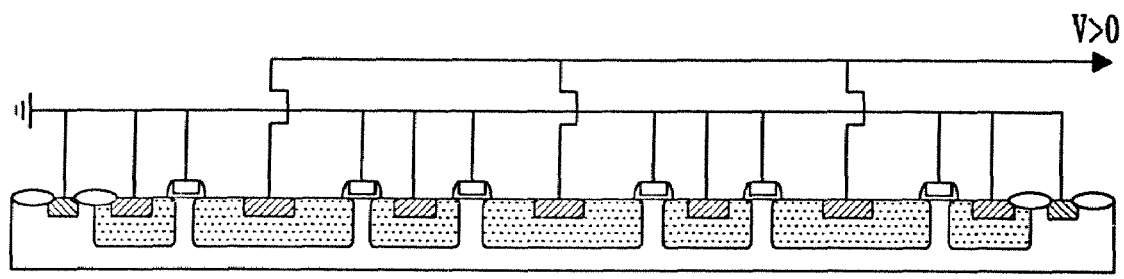
Figure 4A:
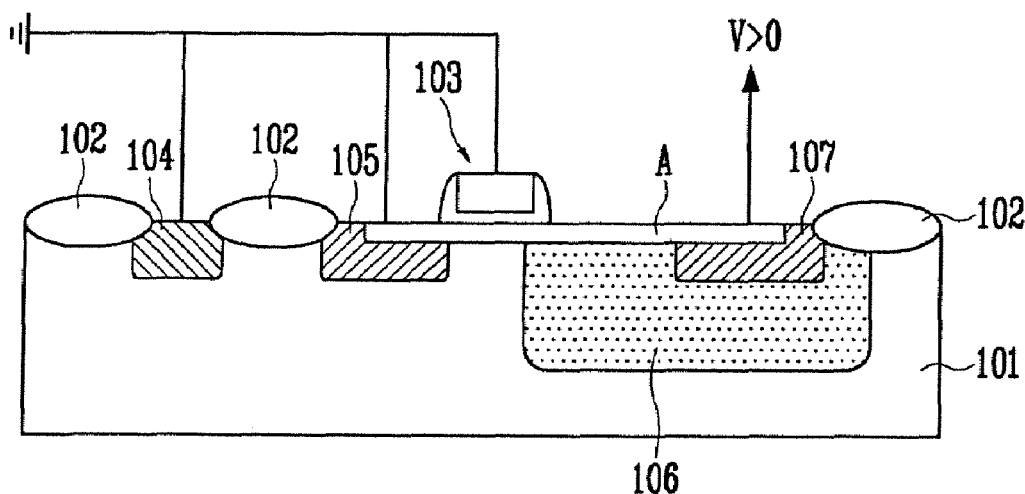
FIGS. 4a and 4b are views illustrating the current paths of the conventional unidirectional and bidirectional GG_DDDNMOS devices.
Figure 4B:
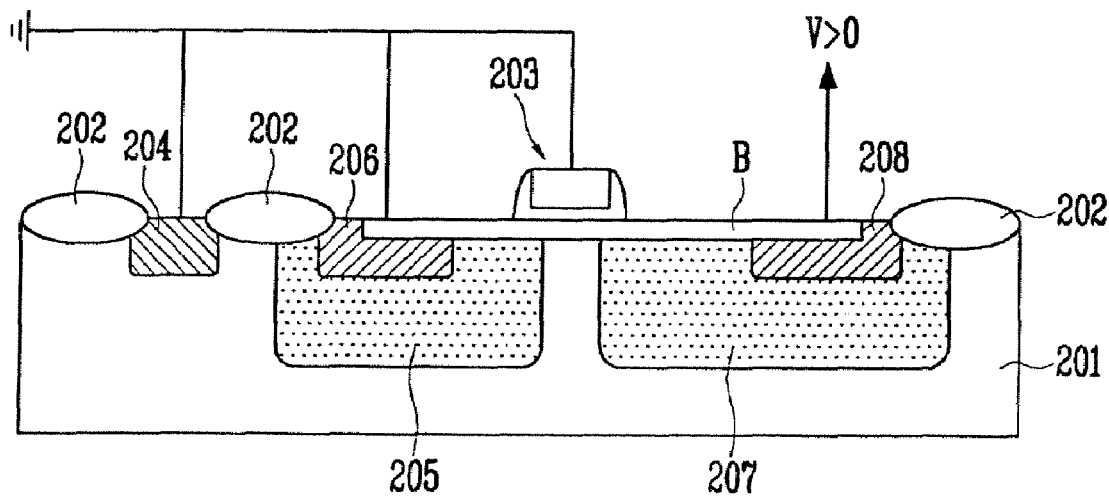
Figure 5A:
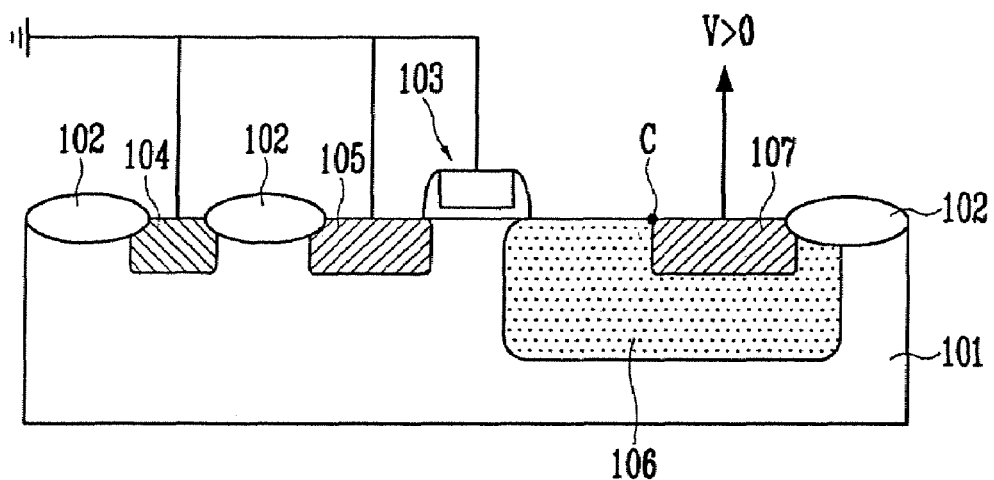
FIGS. 5a and 5b are views illustrating thermal breakdown points of the conventional unidirectional and bidirectional GG_DDDNMOS devices.
Figure 5B:
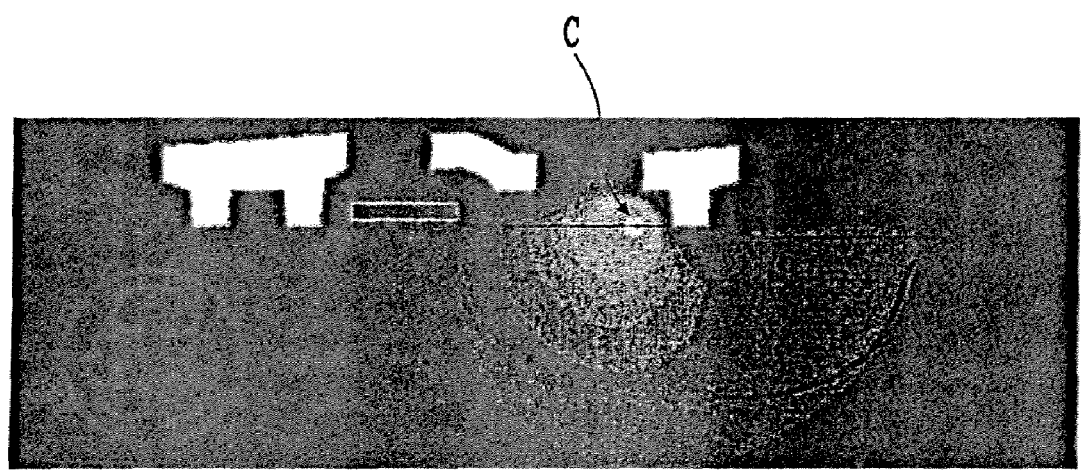
Figure 6A:
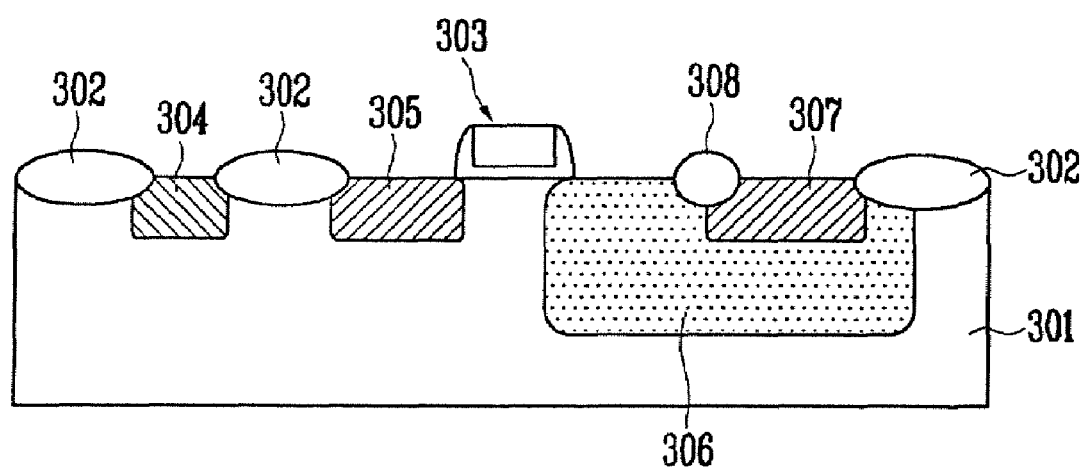
FIGS. 6a and 6b are cross-sectional views of unidirectional and bidirectional DDDNMOS devices according to the present invention.
Figure 6B:
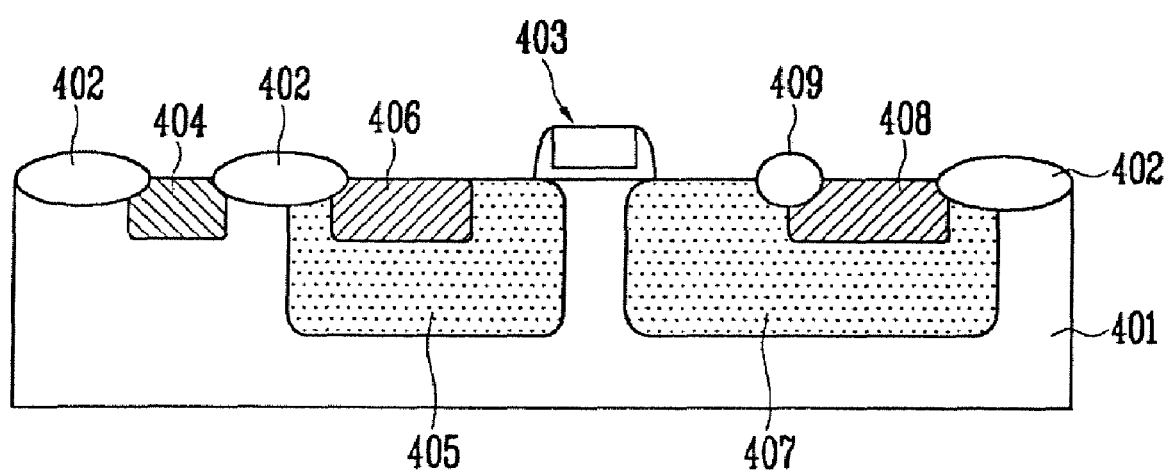

FIGS. 6a and 6b are cross-sectional views of unidirectional and bidirectional DDDNMOS devices according to the present invention.

Referring to FIG. 6a, a plurality of field oxide films 302 are formed in predetermined regions on a P-type semiconductor substrate 301. A gate 303 is formed over the semiconductor substrate 301 between the field oxide films 302. A well pick-up region 304 is formed on the semiconductor substrate 301 between the field oxide film 302 and the field oxide film 302 by means of a high concentration P-type impurity ion implant process. A source 305 is formed on the semiconductor substrate 301 between the field oxide film 302 and the gate 303 by means of a high concentration N-type impurity ion implant process. Furthermore, a drain is formed between the gate 303 and the field oxide films 302 by performing a dual N-type impurity ion implant process. The drain region has a drain active region 307 of a high concentration formed within the drain drift region 306 of a low concentration. An oxide film 308 is formed on a boundary where the drain drift region 306 of a low concentration and the drain active region 307 of a high concentration meet. The source 305 and the drain drift region 307 can be formed at the same time.

Referring to FIG. 6b, a plurality of field oxide films 402 are formed in predetermined regions on a P-type semiconductor substrate 401. A gate 403 is formed over the semiconductor substrate 401 between the field oxide films 402. A well pick-up region 404 is formed on the semiconductor substrate 401 between the field oxide film 402 and the field oxide film 402 by means of a P-type impurity ion implant process. A source 405 is formed on the semiconductor substrate 401 between the field oxide film 402 and the gate 403 by means of a dual N-type impurity ion implant process. A source active region 406 of a high concentration is formed within a source drift region 405 of a low concentration. Furthermore, a drain is formed between the gate 403 and the field oxide films 402 by means of a dual N-type impurity ion implant process. In this time, a drain active region 408 of a high concentration is formed within a drain drift region 407 of a low concentration. An oxide film 409 is formed on a boundary where the drain drift region 407 of a low concentration and the drain active region 408 of a high concentration meet. The source drift region 405 and the drain drift region 407 can be formed at the same time, and the source active region 406 and the drain active region 408 can be formed at the same time.

In order to mitigate concentration of ESD stress current on the DDDNMOS device when the device operates as a device for ESD protection, the present invention proposes the above-described device in which the oxide films 308 and 409 are additionally formed on the boundary where the drain drift region 306 and the drain active region 307 meet and the boundary where the drain drift region 407 and the drain active region 408 meet, respectively, i.e., an Oxide Layer Inserted GG_DDDNMOS (OLI_GG_DDDNMOS). In this time, the oxide films 308 and 409 are not formed not to be in contact with the edges of the gates 303 and 403, respectively. In a common manufacture process of a semiconductor chip, there is a process in which an oxide film is formed so as to electrically separate elements. If the oxide film is formed using a field oxide film, a field oxide film can be formed even on a boundary where the drain drift region and the drain active region meet. That is, in the process of forming the field oxide film, the field oxide film is formed even on the boundary where the drain drift region and the drain active region meet.

As another embodiment of the present invention, a trench type element isolation film can be used instead of the field oxide film.

Figure 7A:
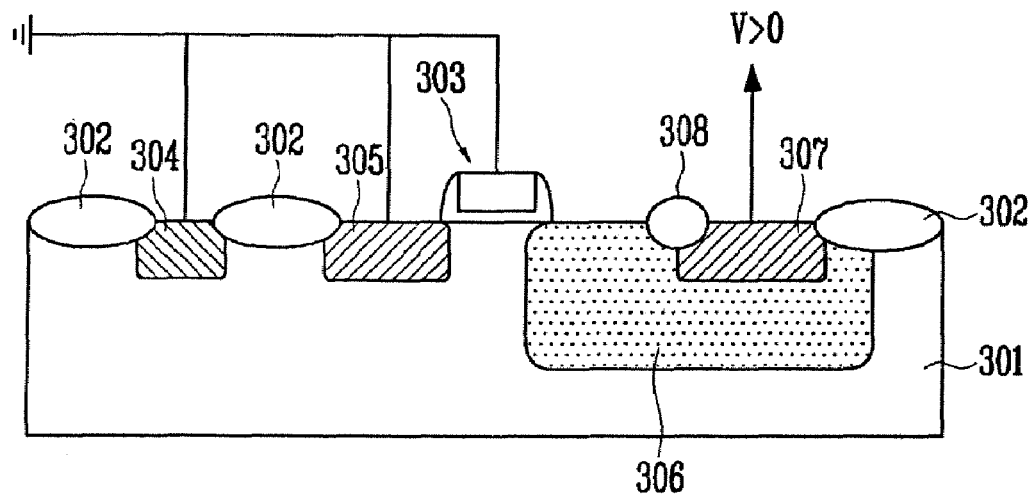
FIGS. 7a and 7b are views illustrating electrode connection modes of OLI_GG_DDDNMOS devices in which the unidirectional and bidirectional DDDNMOS devices according to the present invention are used as devices for electrostatic discharge protection.
Figure 7B:
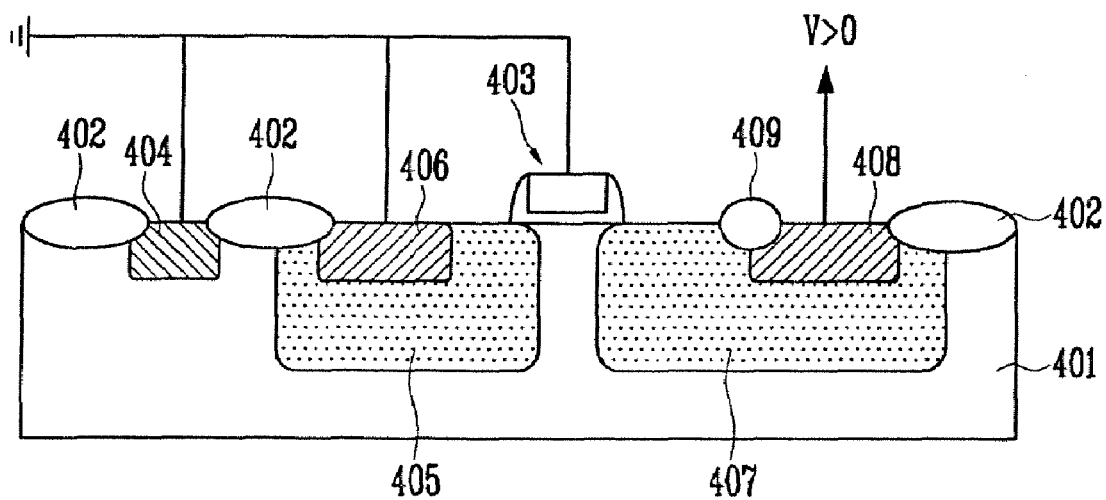

FIGS. 7a and 7b are views illustrating electrode connection modes of OLI_GG_DDDNMOS devices in which the unidirectional and bidirectional DDDNMOS devices according to the present invention are used as devices for electrostatic discharge protection.

In order to use the OLI_GG_DDDNMOS that operates at high voltage according to the present invention as a device for ESD protection, an electrode is constructed in such a manner that the gate, the source and the well pick-up region are bound together and grounded and a positive voltage is applied to the drain, as shown in FIGS. 7a and 7b. If the oxide film is additionally formed on the boundary of the drain drift region and the drain active region as such, there is an effect in that current is distributed over the entire device because the flow of the current concentrated on the surface of the device is interrupted by the additional oxide film. It is thus possible to prevent a temperature of the very limited region in the surface of the device on the boundary of the drain drift region and the drain active region from sharply increasing, and to digest more stress current.

Figure 8A:
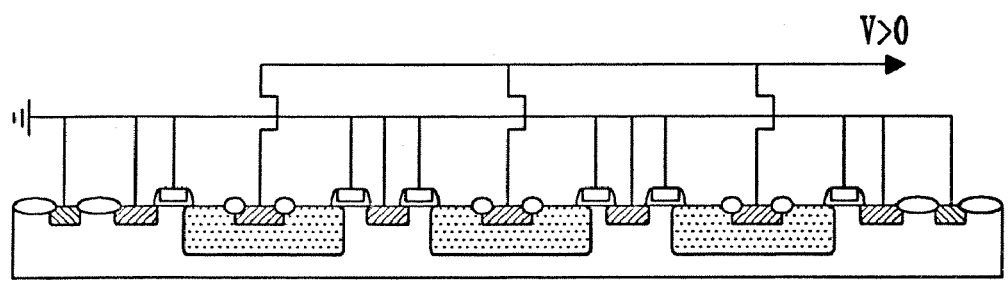
FIGS. 8a and 8b show multi-finger structures of unidirectional and bidirectional OLI_GG_DDDNMOS devices according to the present invention.
Figure 8B:
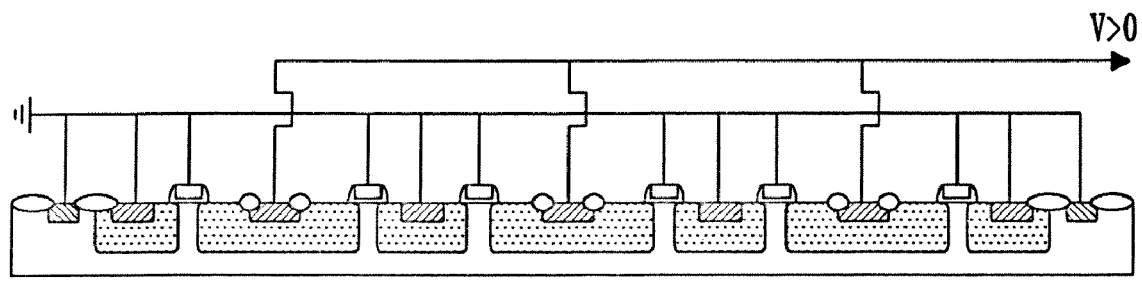

FIGS. 8a and 8b show multi-finger structures of unidirectional and bidirectional OLI_GG_DDDNMOS devices according to the present invention.

In using the OLI_GG_DDDNMOS proposed by the present invention as the device for ESD protection, the structure of the multi-finger structure, which is adopted to cope with a large amount of ESD stress current, is shown in FIGS. 8a and 8b.

Figure 9A:
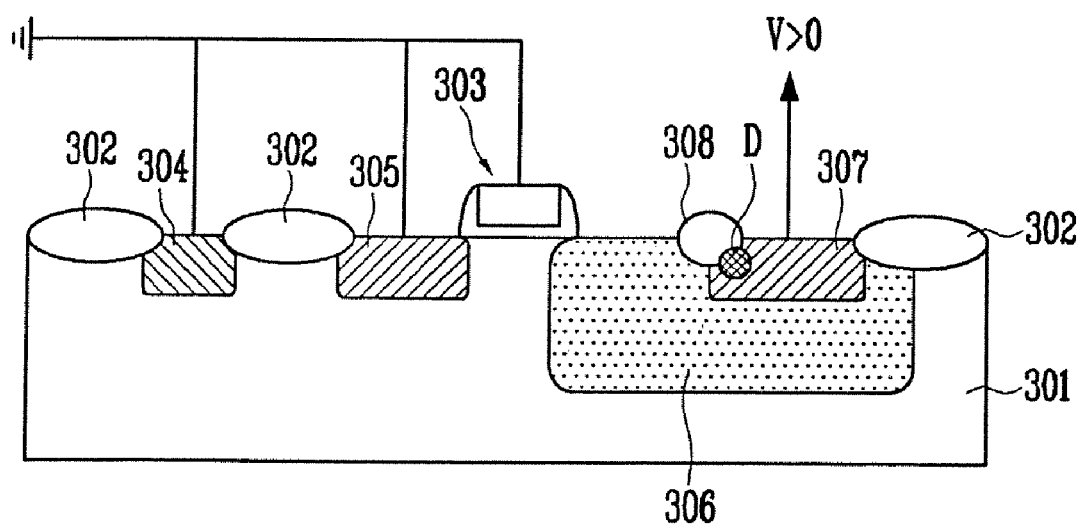
FIGS. 9a and 9b are views illustrating thermal breakdown points of the unidirectional and bidirectional OLI_GG_DDDNMOS device according to the present invention.
Figure 9B:
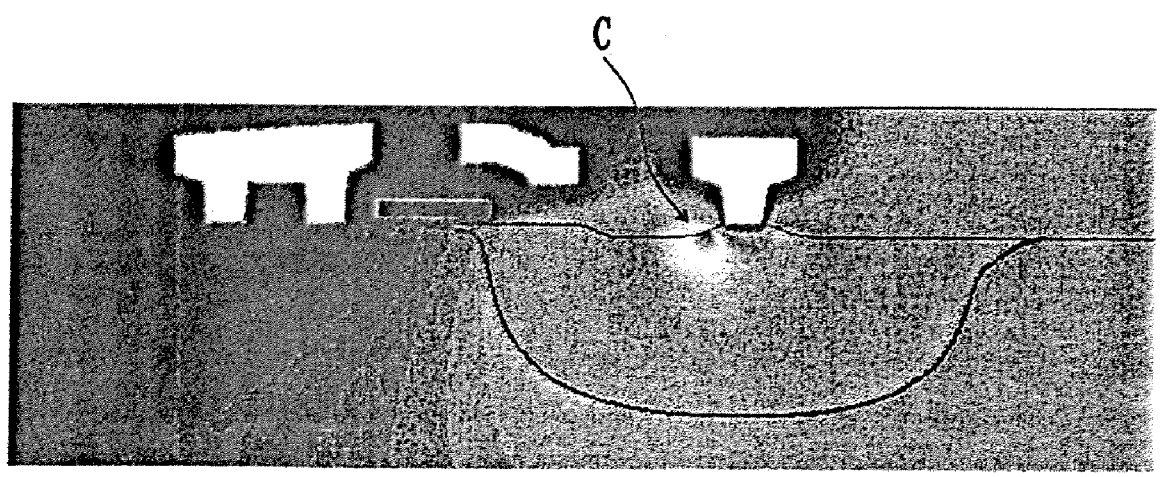

FIGS. 9a and 9b are views illustrating thermal breakdown points of the unidirectional and bidirectional OLI_GG_D-DDNMOS device according to the present invention.

FIGS. 9a and 9b shows a simulation result of confirming a location where a thermal breakdown phenomenon is generated as stress current increases when the unidirectional OLI_GG_DDDNMOS proposed by the present invention operates as a device for ESD protection.

As can be seen from FIG. 9, a thermal breakdown point D was generated at the point where the drain active region and the oxide film meet. When compared with an existing GG_DDDNMOS device, it was found that the thermal breakdown point is spaced apart from the surface of the device, and a highest temperature region is more widely distributed. This means that the current is more widely distributed compared with the existing device. Consequently, it can be seen that the oxide film, which is additionally formed between the drain drift region and the drain active region, can distribute the current concentration on the surface of the device uniformly over the entire device.

Figure 10:
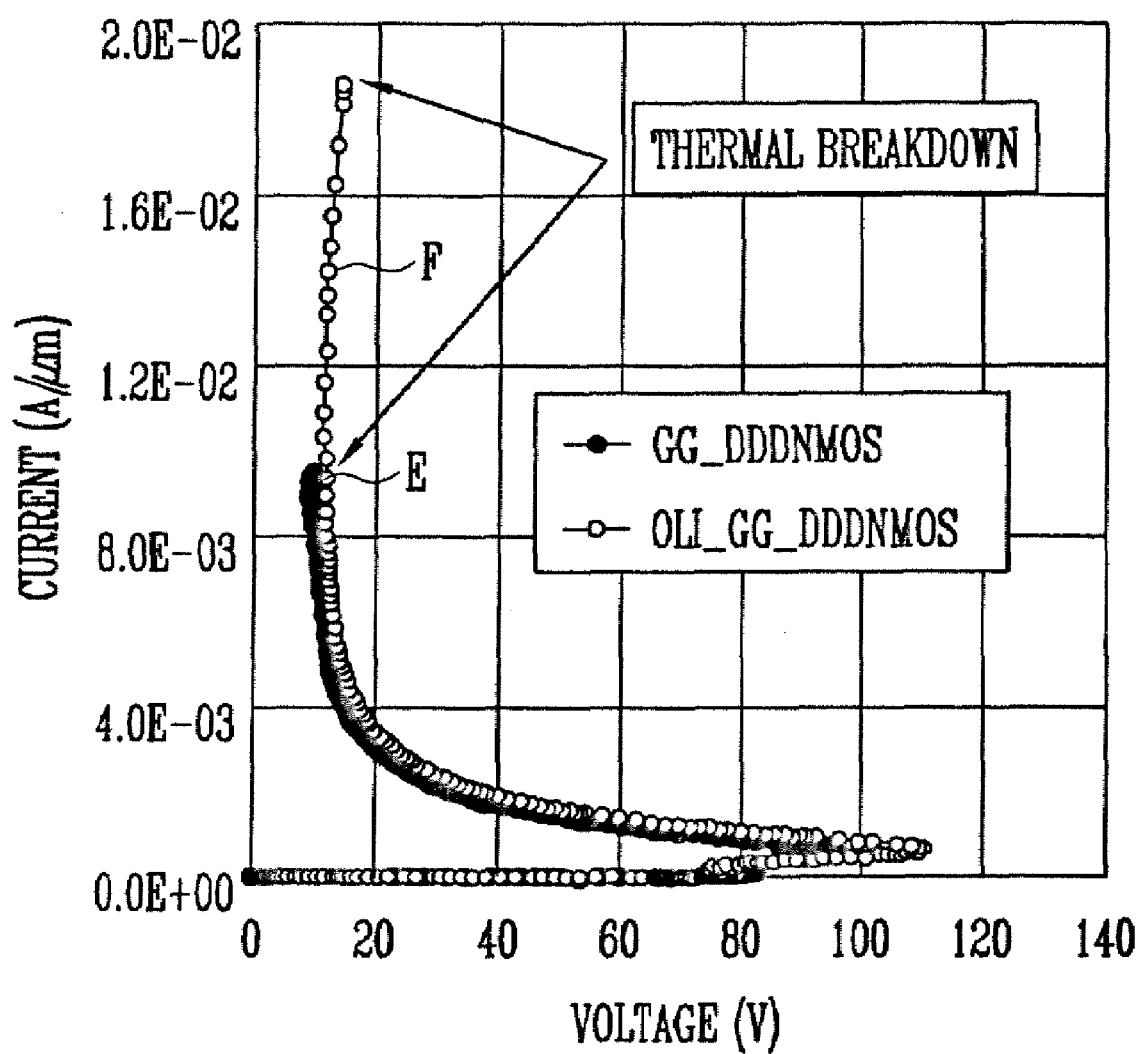
FIG. 10 is a current and voltage characteristic graph of the conventional GG_DDDNMOS device and the OLI_GG_DDDNMOS device according to the present invention.

FIG. 10 is a current and voltage characteristic graph of the conventional GG_DDDNMOS device and the OLI_GG_D-DDNMOS device according to the present invention.

From FIG. 10, it can be seen that in the capability of coping with stress current when a thermal breakdown phenomenon occurs, the OLI_GG_DDDNMOS device F according to the present invention is twice stronger than the existing GG_DDDNMOS device E.

As described above, the present invention can have the following effects by implementing an OLI_GG_DDDN-MOS device in which an oxide film is added on a boundary of a drain drift region and a drain active region.

Firstly, when an existing GG_DDDNMOS device operates as a device for ESD protection device, a phenomenon that stress current is concentrated on the surface of the device can be mitigated. After confirming a point where a thermal breakdown phenomenon is generated as stress current increases when the OLI_GG_DDDNMO device proposed by the present invention operates as a device for ESD protection device, it was found that the thermal breakdown point is generated at the point where the drain active region and the additionally formed oxide film meet. However, when compared with an existing GG_DDDNMOS device, it was found that the thermal breakdown point is spaced apart from the surface of the device, and even a highest temperature region is more widely distributed. This means that current is distributed more widely and uniformly compared with the existing device. Consequently, it can be seen that the oxide film, which is additionally formed between the drain drift region and the drain active region, can distribute the current concentration on the surface of the device uniformly over the entire device.

Secondly, if the stress current is not concentrated on the surface of the device for ESD protection but uniformly distributed over the entire device, the device for ESD protection can digest a greater amount of stress current where ESD stress is introduced. As a result of simulation, it was found that in the capability of coping with stress current in an ESD situation, the OLI_GG_DDDNMOS device is twice stronger than the existing GG_DDDNMOS device.

Thirdly, if the capability of a device for ESD protection to cope with stress current is improved, the device for ESD protection, which is included in the semiconductor chip, can be made smaller. Accordingly, a product competitive power can be enhanced since the whole size of a semiconductor chip can be reduced.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A device for electrostatic discharge protection, comprising:
   semiconductor substrate;
   a plurality of field oxide films formed in predetermined regions on the semiconductor substrate;
   a gate formed in a predetermined region on the semiconductor substrate between the field oxide films;
   a well pick-up region formed in a predetermined region on the semiconductor substrate between the field oxide films;
   a source formed in a predetermined region on the semiconductor substrate between the field oxide film and the gate;
   drain drift region formed in a predetermined region on the semiconductor substrate between the gate and the field oxide film;
   a drain active region of a concentration higher than that of the drain drift region, the drain active region being formed in the drain drift region; and
   an oxide film formed only on a boundary of the drain drift region and the drain active region.

2. The device for electrostatic discharge protection as claimed in claim 1, wherein the oxide film is formed not to be in contact with the gate.

3. The device for electrostatic discharge protection as claimed in claim 1, wherein the well pick-up region, the source and the gate are applied with a ground voltage, and the drain active region is applied with a positive voltage.

4. A device for electrostatic discharge protection, comprising:
   a semiconductor substrate;
   a plurality of field oxide films formed in predetermined regions on the semiconductor substrate;
   a gate formed in a predetermined region on the semiconductor substrate between the field oxide films;
   a well pick-up region formed in a predetermined region on the semiconductor substrate between the field oxide films;
   a source drift region formed in a predetermined region on the semiconductor substrate between the field oxide film and the gate;
   a source active region of a concentration higher than that of the source drift region, the source active region being formed within the source drift region;
   a drain drift region formed in a predetermined region on the semiconductor substrate between the gate and the field oxide film;
   a drain active region of a concentration higher than that of the drain drift region, the drain active region being formed in the drain drift region; and
   an oxide film formed only on a boundary of the drain drift region and the drain active region.

5. The device for electrostatic discharge protection as claimed in claim 4, wherein the oxide film is formed not to be in contact with the gate.

6. The device for electrostatic discharge protection as claimed in claim 4, wherein the well pick-up region, the source active region and the gate applied with a ground voltage, and the drain active region is applied with a positive voltage.

* * * * *